US006714179B1

(12) United States Patent
Waterman (10) Patent No.: US 6,714,179 B1
(45) Date of Patent: Mar. 30, 2004

(54) SYSTEM AND METHOD FOR ACTUATING A LIQUID CRYSTAL DISPLAY (75) Inventor: John Karl Waterman, Mesa, AZ (US)

(73) Assignee: Three-Five Systems, Inc., Tempe, AZ (US)

( * ) Notice: Subject to any disclaimer, the term of this patent is extended or adjusted under 35 U.S.C. 154(b) by 227 days.

(21) Appl. No.: 09/685,834

(22) Filed: Oct. 9, 2000

(51) Int. Cl.[7] .............................. G09G 3/36; G09G 5/00
(52) U.S. Cl. ........................... 345/87; 345/98; 345/204; 345/690
(58) Field of Search ........................... 345/87, 98, 99, 345/204, 690

(56) References Cited

U.S. PATENT DOCUMENTS

| 5,142,643 A |   | 8/1992  | Yonejirou et al. | 358/160 |
|---|---|---|---|---|
| 5,278,558 A |   | 1/1994  | Roth | 341/120 |
| 5,369,432 A | * | 11/1994 | Kennedy | 348/181 |
| 5,600,345 A | * | 2/1997  | Dingwall et al. | 345/100 |
| 5,751,279 A | * | 5/1998  | Okumura | 345/212 |
| 5,956,006 A | * | 9/1999  | Sato | 345/88 |

* cited by examiner

*Primary Examiner*—Bipin Shalwala
*Assistant Examiner*—Jimmy H. Nguyen
(74) *Attorney, Agent, or Firm*—Baker Botts L.L.P.

(57) ABSTRACT

A matrix of liquid crystal pixels (22) is provided. A digital-to-analog converter (DAC) (102, 114, and 126) is coupled to the matrix and produces an output voltage that can be applied to one or more pixels in the matrix. The DAC (102, 114, and 126) receives a calibrated multi-bit digital input and generates its output voltage to correspond to the digital input. A reference voltage generator (128) generates at least two reference voltages at an output that is coupled to one input of a comparator (132). Another input of the comparator (132) is coupled to the DAC (102, 114, and 126) output. When the comparator (132) is activated, it outputs one of two signals: a first signal when one input receives a higher voltage; and a second signal when the other input receives a higher voltage. A digital calibrator (100) has at least one output and at least one input. The digital calibrator (100) is adapted to receive an uncalibrated multi-bit digital signal at the input. The digital calibrator (100) is also adapted to modify the uncalibrated multi-bit digital signal based at least in part on the output of the comparator (132) to produce the calibrated digital signal. The digital calibrator (100) applies the calibrated multi-bit digital signal at the output. The output of the digital calibrator (100) is coupled to the input of the DAC (102, 114, and 126).

2 Claims, 5 Drawing Sheets

SYSTEM AND METHOD FOR ACTUATING A LIQUID CRYSTAL DISPLAY

FIELD OF THE INVENTION

The present invention relates generally to liquid crystal display devices, and more particularly to a system and method for generating on the display screen of a liquid crystal display device pixels accurately shaded in correspondence with a digital or analog video signal.

BACKGROUND OF THE INVENTION

Liquid crystal displays (LCDs) are commonly used in devices such as portable televisions, portable computers, control displays, and cellular phones to display information to a user. LCDs act in effect as a light valve, i.e., they allow transmission of light in one state, block the transmission of light in a second state, and some include several intermediate stages for partial transmission. When used as a high resolution information display, as in one application of the present invention, LCDs are typically arranged in a matrix configuration with independently controlled pixels. Each individual pixel is signaled to selectively transmit or block light from a backlight (transmission mode), from a reflector (reflective mode), or from a combination of the two (transflective mode).

An LCD pixel can control the transference for different wavelengths of light. For example, an LCD can have pixels that control the amount of transmission of red, green, and blue light independently. In some LCDs, voltages are applied to different portions of a pixel to control light passing through several portions of dyed glass. In other LCDs, different colors are projected onto the pixel sequentially in time. If the voltage is also changed sequentially in time, different intensities of different colors of light result. By quickly changing the wavelength of light to which the pixel is exposed an observer will see the combination of colors rather than sequential discrete colors. Several monochrome LCDs can also result in a color display. For example, a monochrome red LCD can project its image onto a screen. If a monochrome green and monochrome blue LCD are projected in alignment with the red, the combination will be full color.

The monochrome resolution of an LCD can be defined by the number of different levels of light transmission that each pixel can perform in response to a control signal. A second level is different from a first level when the user can tell the difference between the two. An LCD with greater monochrome resolution will look clearer to the user.

LCDs are actuated pixel-by-pixel, either one at a time or several simultaneously. A voltage is applied to each pixel and the liquid crystal responds to the voltage by transmitting a corresponding amount of light. In some LCDs an increase in the actuation voltage decreases transmission, while in others it increases transmission. When multiple colors are involved for each pixel, multiple voltages are applied to the pixel at different positions or times depending upon the LCD. Each voltages controls the transmission of a particular color. For example, one pixel can be actuated to allow only blue light to be transmitted while another allows only green. A greater number of different light levels available for each color results in a much greater number of possible combination colors.

Converting a complex digital signal that represents an image or video into voltages to be applied to the pixels of an LCD involves circuitry that can limit the monochrome resolution. The signals necessary to drive a single color of an LCD are both digital and analog. It is digital in that each pixel requires a separate selection signal, but it is analog in that an actual voltage is applied to the pixel to determine light transmission. The conversion from a bit-representation of the desired light transmission, as communicated in the image or video signal, to an actual voltage that controls the light transmission can introduce errors that reduce the monochrome resolution of the LCD. For example, if a Digital-to-Analog Converter (DAC) takes as an input a bit-representation of voltage that includes 256 voltage levels and outputs voltages between 0 and 16 volts, the ideal output levels would differ by 62.5 millivolts (mV). If that DAC has an error of +/−40 mV, a user is likely to confuse the light level that corresponds to a particular voltage with the light levels of its neighbors and the number of effectively different levels of monochrome display is halved. Taking into account the errors that exist for each color of light being controlled in a pixel of the LCD reveals that the number of different combinations can be severely reduced. Further, if multiple DACs are used to drive the LCD, each DAC controlling a fraction of the pixels; then inaccuracies DAC-to-DAC can lead to distortions of the bit representation of the desired light transmission.

SUMMARY OF THE INVENTION

The present invention is directed to a system and method for actuating a liquid crystal display.

In one embodiment of the present invention, a matrix of liquid crystal pixels is provided. A digital-to-analog (DAC) converter is coupled to the matrix and produces an output voltage that can be applied to one or more pixels in the matrix. The DAC receives a calibrated multi-bit digital input and generates its output voltage to correspond to the digital input. A reference voltage generator generates at least two reference voltages at an output that is coupled to one input of a comparator. The other input of the comparator is coupled to the DAC output. When the comparator is activated, it outputs one of two signals: a first signal when one input receives a higher voltage; and a second signal when the other input receives a higher voltage. A digital calibrator has at least one output and at least one input. The digital calibrator is adapted to receive an uncalibrated multi-bit digital signal at the input. The digital calibrator is also adapted to modify the uncalibrated multi-bit digital signal based at least in part on the output of the comparator to produce the calibrated digital signal. The digital calibrator applies the calibrated multibit digital signal at the output. The output of the digital calibrator is coupled to the input of the digital-to-analog converter.

In a more specific embodiment of the present invention, the DAC comprises first and second circuits. The first circuit is adapted to receive a multi-bit digital signal as an input and to output a current corresponding to the digital signal. The second circuit receives the current generated by the first circuit and outputs a voltage corresponding to the current. In one embodiment the second circuit includes an operational amplifier.

In another embodiment of the present invention, the system includes at least a second DAC. The system also includes a multiplexer circuit coupled to the comparator, the reference voltage generator, and the DACs. The multiplexer circuit is adapted to receive the at least two reference voltages and to apply one of the reference voltages to one input of the comparator. The multiplexer circuit is also adapted to receive the output voltages of the DACs and to apply one of the output voltages to the other input of the comparator. In a more specific embodiment, the multiplexer circuit includes two multiplexers. The first multiplexer receives the reference voltages and the second receives the DAC output voltages. In a more specific embodiment, the digital calibrator is coupled to the multiplexer circuit and controls the output of the multiplexer circuit.

A technical advantage of the present invention is that it controls the light level of pixels of a liquid crystal display. Another technical advantage of the present invention is that it calibrates digital input to take into account inaccuracies in the digital-to-analog voltage conversion process. Another technical advantage of the present invention is that it allows a larger number of different monochrome actuation levels to be achieved using the same digital-to-analog conversion circuitry. Another technical advantage of the present invention is that it can accept different levels of digital specification of desired voltage. Another technical advantage of the present invention is that calibration across multiple digital-to-analog converters is consistent.

Other technical advantages of the present disclosure will be readily apparent to one skilled in the art from the following figures, descriptions, and claims. Various embodiments of the invention obtain only a subset of the advantages set forth. No one advantage is critical to the invention. For example, one embodiment of the present invention may only provide the advantage of controlling the pixels of a liquid crystal display, while other embodiments may provide several of the specified and apparent advantages.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein.

DETAILED DESCRIPTION OF THE PREFERRED EMBODIMENTS

Figure 1:
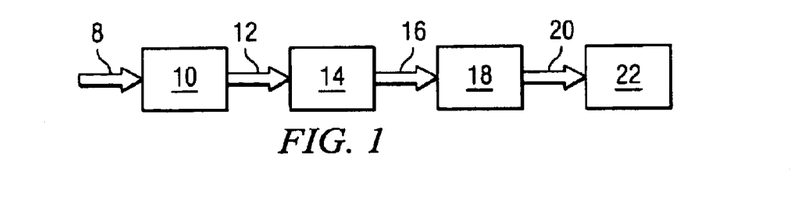
FIG. 1 is a block diagram of a liquid crystal display actuating system in accordance with one embodiment of the present invention.

Turning to the drawings, embodiments of the present invention will now be described. FIG. 1 depicts a high-level block diagram of a system for actuating pixels of a liquid crystal display screen in accordance with video data. A video software program 10 accesses stored data 8 representing an image or series of images. The video software program 10 locates pixel-specific information in the stored data 8 according to its protocol. For example, the data may be stored in Apple Corporation's Quicktime format, Microsoft Corporation's Media Player format, or the MPEG-2 standard format. The video software outputs pixel-specific digital data for one or more colors 12. For example, the pixel-specific data may include 8-bits for each of red, green, and blue. A signal that can be referred to as an RGB signal. In another embodiment, the software program 10 receives video data directly from an optical recording device such as a video camera.

The pixel-specific data 12 corresponds to the settings of the video software 10 and the contents of the stored data 8 (or the optical recording device), but is not necessarily consistent with the physical characteristics of the liquid crystal display 22. The pixel-specific data 12 is received by image rescaling and frame rate conversion electronics 14. The conversion electronics 14 converts the pixel-specific data 12 so that the number of rows, the number of columns, and the number of images to be displayed in a set amount of time correspond to the capabilities of the liquid crystal display. The conversion electronics 14 outputs modified pixel-specific data 16. In an alternate embodiment, a real time source of video data, such as a video camera, can be configured to provide pixel-specific video data 16 without a need for a software program 10 or conversion electronics 14.

The pixel-specific data 16 is received by liquid crystal display driver electronics 18. The driver electronics 18 converts the pixel-specific data 16 from digital form to pixel-specific voltages in analog form. In one embodiment, a single voltage source for each pixel drives a monochrome display. In another embodiment, a pixel has several voltages each for a different color, sequentially applied, in order to drive a full color display. Driver electronics 18 can be provided for each color for which there is pixel-specific data 16. The driver electronics then provides those pixel charging voltages and control signals 20 to the liquid crystal display 22. The pixel-charging voltages each correspond to one pixel of one image. The control signals are used by the liquid crystal display for several functions, including to match the voltages to their pixels, to provide a comparison voltage for the pixel charging voltages, and to provide a voltage for charging pixels outside the image.

The liquid crystal display 22 applies voltages to individual pixels and, in some embodiments, to particular colors for each pixel. The liquid crystal display 22 selects pixels to which to apply voltages in accordance with received control signals. The voltages change the light transfer characteristics of the pixels. The collective visual impact of the selectively lighted pixels portrays an image.

Figure 2:
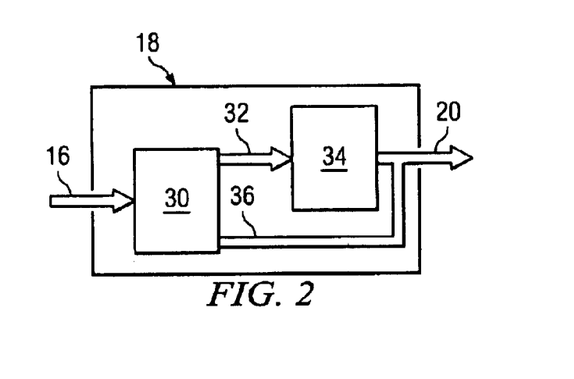
FIG. 2 is a block diagram of liquid crystal display driver electronics in accordance with one embodiment of the present invention.

FIG. 2 depicts a block diagram of the driver electronics designated generally by 18. A driver circuit 30 receives the pixel specific data 16. The driver circuit 30 converts the pixel-specific data into corresponding analog currents 32. Those currents 32 are provided to an analog conversion circuit 34. The analog conversion circuit 34 produces analog voltages that correspond to the currents. Those analog voltages 20 are provided to the liquid crystal display along with control signals from the driver circuit 30. Feedback signals 36 travel from the analog conversion circuit 34 to the driver circuit 30. The feedback signals 36 are used to calibrate the video digital signals as discussed with reference to FIG. 4.

Figure 3:
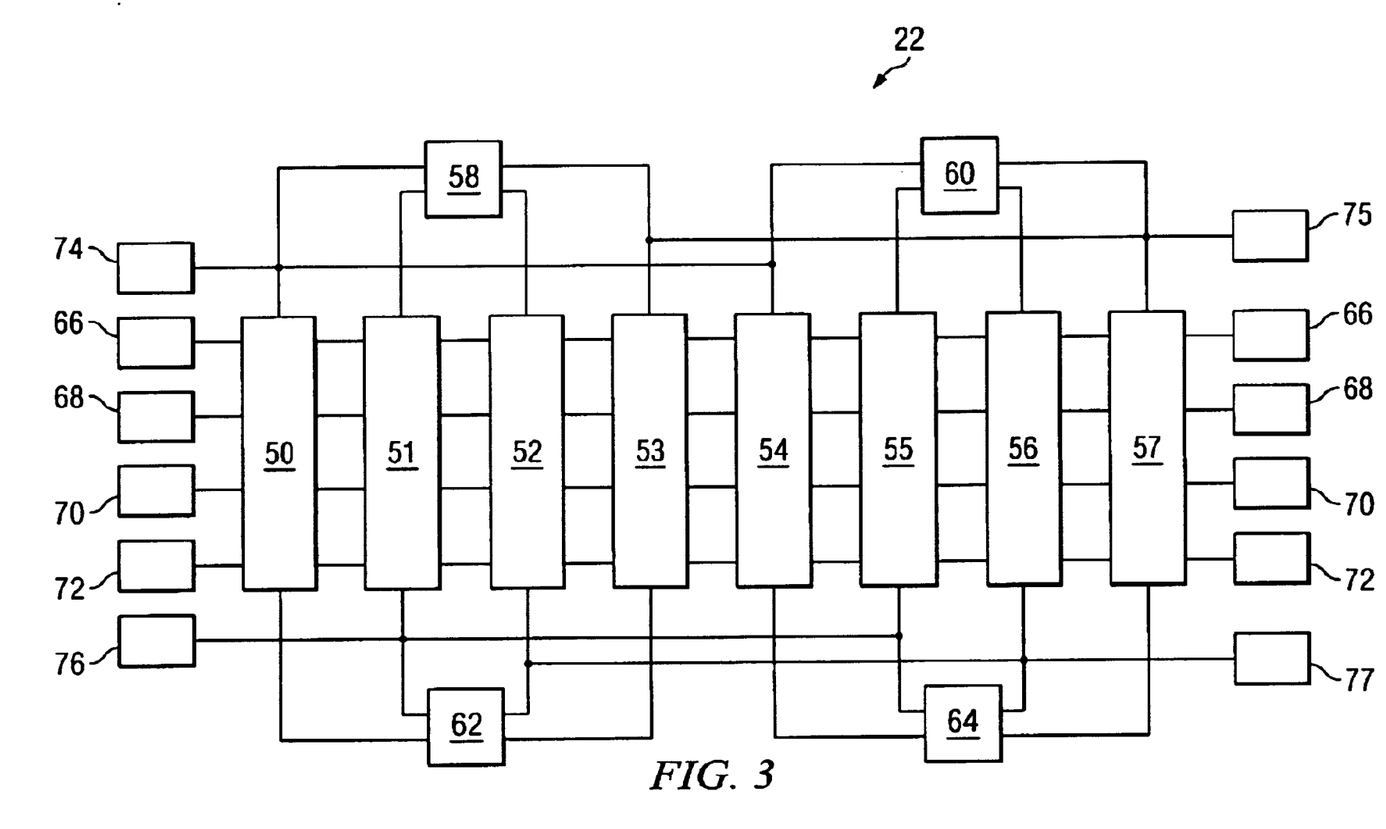
FIG. 3 is a block diagram of liquid crystal display circuitry in accordance with the present invention.

FIG. 3 depicts a block diagram of liquid crystal display circuitry designated generally by 22. While the depicted circuitry only has eight columns and four rows for simplicity, many more rows and columns can be used with an actual display. Each of the analog voltage inputs 74–77 applies a received analog voltage to the pixel columns 50–57. One of the column drivers 58–64 and one of the row drivers 66–72 are active so that each of the analog voltages is applied to a single pixel. While the figure depicts four simultaneous pixel actuations, other embodiments could include more or fewer simultaneous pixel actuations. In another embodiment, multiple pixels are actuated with the same voltage. In one embodiment, a separate set of circuitry is provided for each color of the pixel matrix. In another embodiment, the row drivers 66–72 and column drivers 58–64 each has an associated shift register. A control signal from the driver circuit 30 causes the active column driver to shift by one. For example, the shift register shifts from column driver 58 to column driver 60. When the last column driver is reached the row driver is shifted by one and the row driver resets. The pixel voltages are then provided in the same order to correspond to the changing shift registers.

Figure 4:
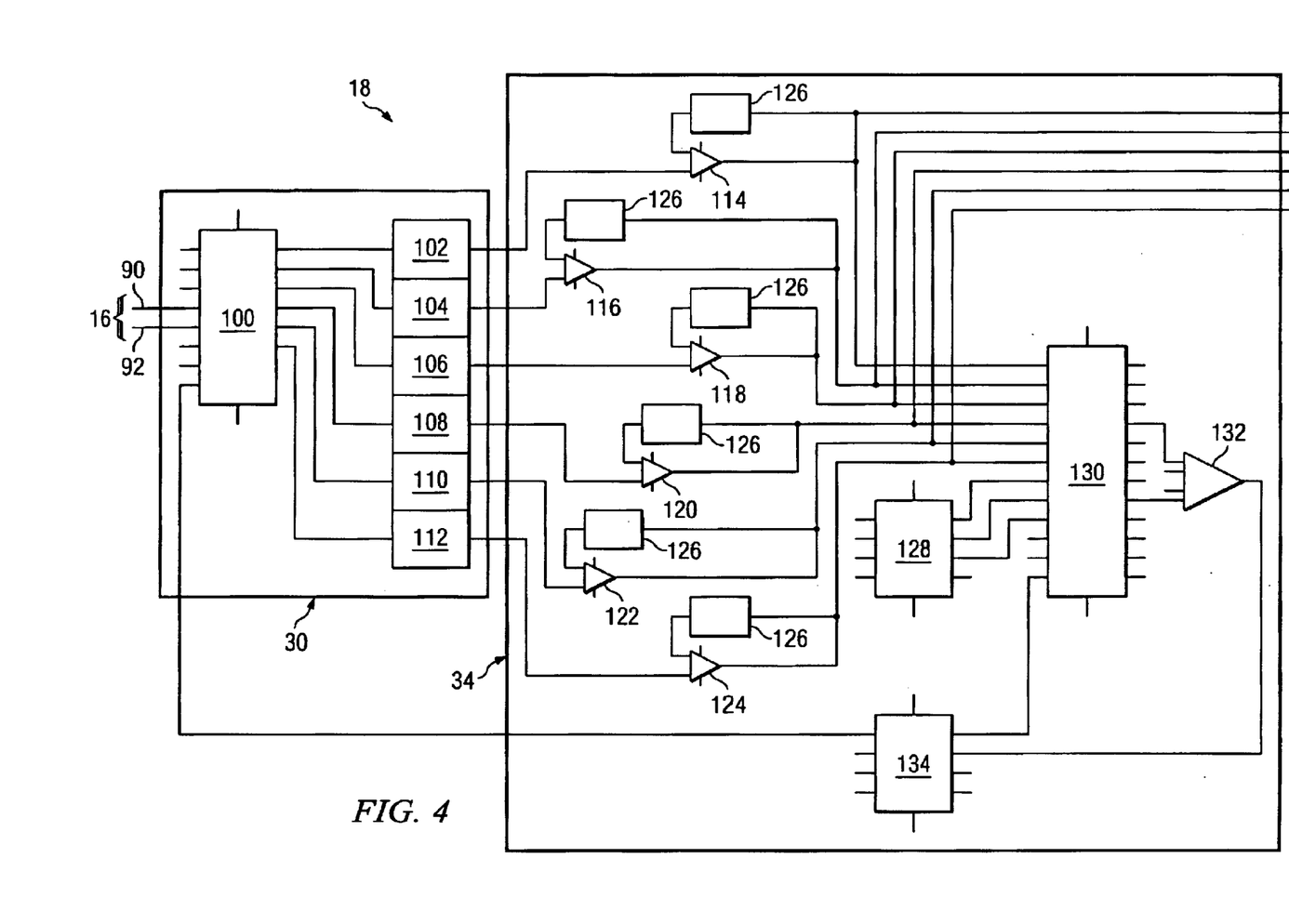
FIG. 4 is a circuit diagram of liquid crystal display driver electronics in accordance with one embodiment of the present invention.

FIG. 4 depicts a circuit diagram of the liquid crystal display driver electronics designated generally as 18. The driver circuit 30 includes a calibration circuit 100 that receives uncalibrated pixel-specific data 90, 92. In one embodiment, the data is 8 bits per pixel with 256 possible levels. The calibration circuit 100 calibrates the uncalibrated pixel-specific data 90, 92 based on results from a feedback circuit, as discussed below. The calibrated data can have more definition that the uncalibrated date in order to allow greater calibration. In one embodiment, the calibrated data is 10 bits per pixel corresponding to 1024 levels. In other embodiments, the calibrated data can include more bits per pixel, e.g., 11 or 12 bits corresponding to 2048 or 4096 levels, respectively.

The calibrated pixel-specific data is provided to one of four fast digital-to-analog circuits (DACs) 102–108. The fast DACs 102–108 must have inputs that can accept the bitsize of the calibrated data. Thus, if the calibrated data is 10 bit, the DACs 102–108 must be able to accept and convert 10-bit data. The fast DACs 102–108 output currents that correspond to the digital input. Those output currents are coupled to the analog conversion circuit 34.

In addition to the pixel-specific data provided to the fast DACs 102–108, the calibration circuit 100 also provides digital data to the slow digital-to-analog converters (DACs) 110–112. In one embodiment, not all of the pixels in the liquid crystal display 22 are activated in response to a image signal. A ring of pixels around the image is kept at a constant voltage level to frame the image. In many liquid crystal displays, setting a pixel's light transference level involves applying voltages at two points. The difference between the voltages controls the pixel. In one embodiment, the first slow DAC 110 receives a digital signal representing the voltage level to be applied to one point of every pixel. The difference between that voltage and the pixel-specific voltage controls the light transfer of the pixel. The second slow DAC 112 receives a digital signal representing the voltage level for the ring pixels. Because these values do not change from pixel to pixel, the slow DACs 110–112 can adequately track the digital input.

The analog conversion circuit 34 receives each output current of the DACs 102–112 at one input of an operational amplifier 114–124. A feedback circuit 126 for each operational amplifier 114–124 controls the ratio of voltage output to current input. The output voltages of the operational amplifiers are coupled to the multiplexer circuit 130 and the liquid crystal display 22.

The analog conversion circuit 34 also includes a reference voltage generator 128. The reference voltage generator 128 provides a plurality of reference voltages within the range of voltages produced by the operational amplifiers 114–124 from the output of the DACs 102–112. The reference voltages are coupled to the multiplexer circuit 130.

In one embodiment, a first reference voltage, $V_{REF\_HI}$, is set between 13.2 volts and 14.0 volts; a second reference voltage, $V_{REF\_MID}$, is set between 7.7 volts and 8.0 volts; and a third reference voltage, $V_{REF\_LO}$, is set between 2.0 volts and 2.2 volts. In another embodiment, the $V_{REF\_MID}$ and $V_{REF\_LO}$ are generated by a voltage divider circuit coupled to $V_{REF\_HI}$ and ground as inputs.

In another embodiment, it is more important that the reference voltages be accurate relative to each other than that they be absolutely accurate. For example, if the voltage difference between $V_{REF\_MID}$ and $V_{REF\_LO}$ is known with minimal error and the voltage difference between $V_{REF\_HI}$ and $V_{REF\_LO}$ is known with minimal error, the three voltages may have a greater error with respect to ground without reducing the accuracy of pixel shading.

The multiplexer circuit 130 connects one of the output voltages of the operational amplifiers 114–124 to an input of a comparator. The multiplexer circuit 130 also connects one of the reference voltages from the reference voltage generator 128 to the other input of the comparator 132. The output voltage and reference voltage are selected by the multiplexer circuit 130 is response to commands from an internal state machine 134. In one embodiment, the multiplexer circuit 130 includes one multiplexer for the output voltages and one multiplexer for the reference voltages.

The analog conversion circuit 34 also includes the internal state machine 134. The internal state machine 134 is coupled to the multiplexer circuit 130 to control the inputs of the comparator 132. The internal state machine 134 is also coupled to the output of the comparator 132. The calibration circuit 100 is coupled to and communicates with the internal state machine 134. Together, the calibration circuit 100 and the internal state machine 134 determine the digital signal that corresponds to each DAC-operational amplifier pair, for example 102 and 114, for each reference voltage.

In one embodiment, the digital signal is determined by directing the multiplexer circuit 130 to connect a specific voltage output and reference voltage to the comparator 132. The calibration circuit 100 then increments the digital signal provided to the DAC. For example, if the voltage output of operational amplifier 114 is connected to the comparator 132 by the multiplexer circuit 130, then the calibration circuit will increment the digital signal provided to the corresponding DAC 102.

The digital signal can be incremented in multi-bit steps. For example, if the DACs 102–112 are 10-bit DACs, then there are 1024 possible digital signals. By the incrementing based on the fourth least significant bit, 16 signals are traversed with each incrementation. When the comparator 132 changes output in response to a 16-signal step, the digital signals for each of the sixteen can then be incremented through to find the closest 10-bit digital signals that bound the output voltage that matches the reference voltage.

As the digital signal is incremented, the DAC output changes and the operational amplifier output changes. At some point, those changes overtake the constant reference voltage and the output of the comparator 132 changes. The internal state machine 134 communicates the change in comparator 132 output to the calibration circuit 100. The calibration circuit records the digital signal at which the comparator 132 output changed. By repeating this process, see FIG. 6, digital signals are recorded for each DAC-reference voltage combination.

The calibration circuit 100 has access to ideal digital signal information. Given the voltage output range for the DAC-operational amplifier combinations and the level of the reference voltages, the digital signals that would change the comparator output for a linear conversion can be determined. For example, if the output range is 0–16 volts, the reference voltages are 4, 8, and 12, and the digital signals are 10-bit, then the digital signals of 256, 512, and 768 (out of the 1024 10-bit signals) would change the comparator output for ideal, linear operation.

The calibration circuit 100 compares the recorded digital signals for a particular DAC-operational amplifier combination with the expected ideal linear signals for each reference voltage. The differences determine slope and offset corrections to be used to calibrate uncalibrated video data.

In one embodiment with three reference voltages, corrective slopes and offsets are calculated. A slope defined by the change in bit representation divided by the change in output analog voltage is predicted and then measured for the two lower voltages and the two higher voltages. The ideal slope, the slope that would result from exactly equal analog voltage steps corresponding to each digital increment, is compared to the measured slope and a difference slope can be determined. Offsets can be determined by the difference between the expected bit representation for a reference voltage and the measured bit representation for a reference voltage. An uncalibrated digital signal below the midpoint is multiplied by the difference slope determined from the lower reference voltages and the result is added to the offset. The sum is calibrated. An uncalibrated digital signal above the midpoint is multiplied by the difference slope determined from the higher reference voltages and the result is added to the offset. The sum is calibrated.

In another embodiment with three reference voltages, the following formulas are used. Delta1 is calculated as the difference between 1) the binary difference between the measured digital signals for $V_{REF\_HI}$ and $V_{REF\_MID}$, and 2) the ideal expected difference between those values. Delta2 is calculated as the difference between the measured digital signal for $V_{REF\_HI}$ and the ideal expected signal. Delta3 is calculated as the difference between 1) the binary difference between the measured digital signals for $V_{REF\_LO}$ and $V_{REF\_MID}$, and 2) the ideal expected difference between those values. Delta4 is calculated as the difference between the measured digital signal for $V_{REF\_LO}$ and the ideal expected signal. An uncalibrated digital signal below the midpoint is multiplied by 1+(Delta3/384) and then added to Delta4−Delta3/3. An uncalibrated digital signal above the midpoint is multiplied by 1+(Delta1/384) and then added to Delta2−Delta1*7/3. The results are calibrated signals. At the midpoint, the same result is reached for either set of corrections.

In one embodiment, calibration calculations are performed on each uncalibrated digital signal as it is received. In another embodiment, calibration calculations for each possible digital signal are performed and stored in a lookup table. When an uncalibrated digital signal is received, the calculation results can be found in the table.

In one embodiment, the determination of measured digital signals for the DAC-operational amplifier combinations and reference voltages is performed between the frames of a digital video signal. In another embodiment, the determination is performed before the first frame of a video signal is sent to the liquid crystal display 22.

Figure 5:
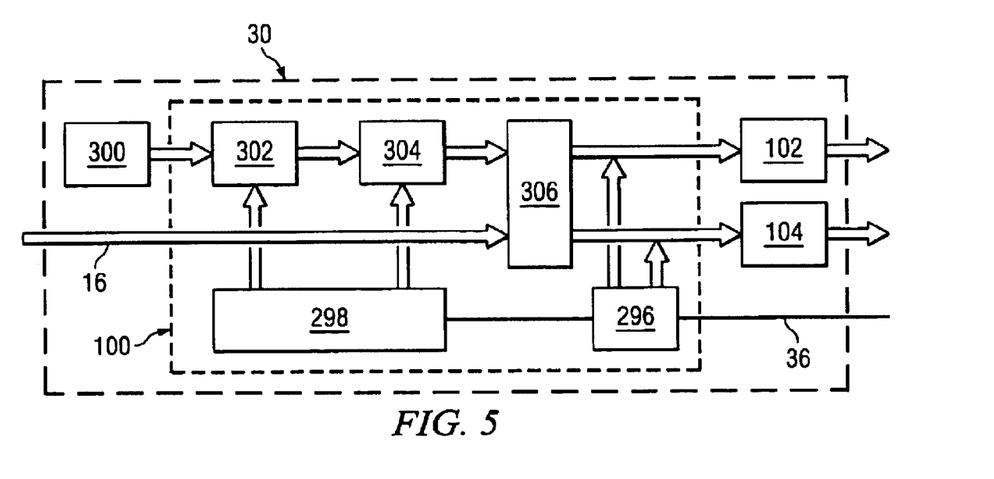
FIG. 5 is a block diagram of a display driver having digital calibration circuitry in accordance with one embodiment of the present invention.

FIG. 5 is a block diagram of a display driver having digital calibration circuitry in accordance with one embodiment of the present invention.

The driver circuit 30 receives uncalibrated digital signals 16. The driver circuit is shown with two analog outputs, unlike FIG. 5 which shows six analog outputs, and other numbers of outputs are possible in other embodiments. In one embodiment the digital signals 16 are 8-bit representations of video. The calibration circuit 100 receives the digital signals 16. In one embodiment a calibrated lookup table 306 has data entries corresponding to 8-bit addresses. The calibrated lookup table 306 can have several entries for a particular 8-bit address, one entry for each digital-to-analog converter. The data entries can have more or less than 8-bits and correspond to the bit-size of the inputs of the digital-to-analog converters 102, 104. In one embodiment the data entries have 10 bits. Each 8-bit digital signal 16 is treated as an address and the data entry at that address for the intended DAC 102, 104 is forwarded to that DAC 102, 104. The analog output of the digital-to-analog converters 102, 104 leaves the driver circuit 30. In an alternative embodiment, separate calibrated lookup tables are maintained for each DAC 102, 104 and the 8-bit digital signal is used as an address at one of the lookup tables with the data entry forwarded to the DAC corresponding to that table.

In one embodiment, the data entries of the calibrated lookup table 306 result from calculations performed on data entries in the ideal lookup table 300. The ideal lookup table contains data entries at 8-bit addresses. The data entries can have more or less than 8-bits. The data entries of the ideal lookup table 300 are the digital signals that would be used to drive a DAC that outputs linearly corresponding analog voltages. Linearly corresponding analog voltages are voltages that can be calculated by multiplying the digital signal by one number and adding a second.

The data entries of the ideal lookup table 300 traverse a multiplication circuit 302 and an addition circuit 304 in order to take into account the some of the deviations of the actual DAC output from linearly corresponding analog voltages. The adjustments are not necessarily limited to a single DAC. For example, an entry in the ideal lookup table 300 may be supplied to the multiplication 302 and addition 304 circuits a first time for the first DAC 102 and a second time for the second DAC 104. The two calculation results can then be placed in two calibrated lookup tables 306. In an alternative embodiment, a single calibrated lookup table 306 has addresses corresponding to the input digital signals 16 appended to bits representing the destination DAC.

The gain/offset circuit 298 supplies signals multiplied and added to the entries of the ideal lookup table 300. The control circuit 296 determines the digital signals for which the DAC outputs exceed reference voltages. The control circuit 296 communicates with the analog conversion circuit 34, see FIG. 4. At a time when the driver circuit 30 is not processing input digital signals 16, the control circuit 296 feeds digital signals to one of the DACs 102, 104 until it receives a signal through the connection 36 indicating that the DAC output has exceeded a reference voltage. In one embodiment the digital signals are sequential. In another embodiment, the control circuit 296 is activated between each video frame. The reference voltage, DAC, and digital signal at which the DAC output exceeded the reference voltage are communicated to the gain/offset circuit 298. From that information, the gain/offset circuit 298 calculates corrective factors for each DAC as discussed with regard to FIG. 4. Those factors are provided to the multiplication circuit 302 and addition circuit 304 to convert entries in the ideal lookup table 300 into entries in the one or more calibrated lookup tables 306. Once the one or more calibrated lookup tables are built, video digital signals are calibrated and provided to the DACs without active participation of the ideal lookup table 300, the gain/offset circuit 298, or the control circuit 296. FIG. 5 represents just one implementation of a calibration circuit. Calibration digital signals can also be calculated for each video digital signals at the time that signal is received.

Figure 6:
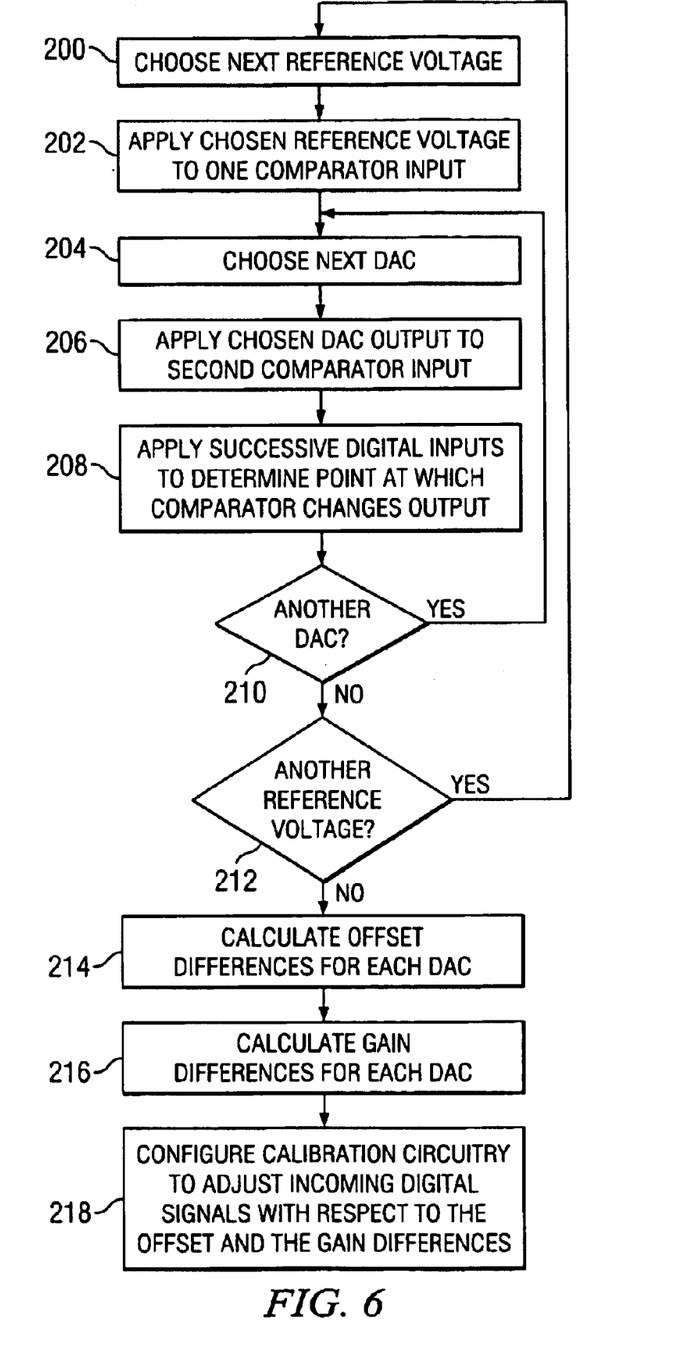
FIG. 6 is a logic flow diagram illustrating a method for pixel calibration tuning in accordance with one embodiment of the present invention.

FIG. 6 is a logic flow diagram illustrating a method for pixel calibration tuning in accordance with one embodiment of the present invention. In the first step 200 a reference voltage is chosen from those available from the reference voltage generator. In the second step 202 the chosen reference voltage is applied to one of the comparator inputs. In one embodiment, the internal state machine sends a control signal to the multiplexer circuit to connect the chosen reference voltage to one of the comparator inputs. The next step 204 chooses a DAC. The output of the chosen DAC is then connected to the other comparator input 206. In one embodiment, the DAC includes two connected circuits and the output of the second circuit is connected to the comparator. In the next step 208, successive digital inputs are applied to the DAC to determine the point at which the comparator changes output. In one embodiment, step 208 includes a partial or full binary tree search. In the next step 210, the process is repeated for additional DACs if there are any. In the next step 212, the process is repeated for additional reference voltages if there are any. In another embodiment, each of the reference voltages can be compared to a single DAC before moving to the next DAC.

Once all the change points are determined for the possible combinations of DAC and reference voltage, offset differences are calculated for each DAC 214. Example calculations for three reference voltages is provided with FIG. 4. In the next step 216, gain difference are calculated for each DAC. An example calculation for three reference voltages is provided with FIG. 4. In the last step 218, calibration circuitry is configured so that digital video signals are corrected before being converted for use by the liquid crystal display.

Figure 7:
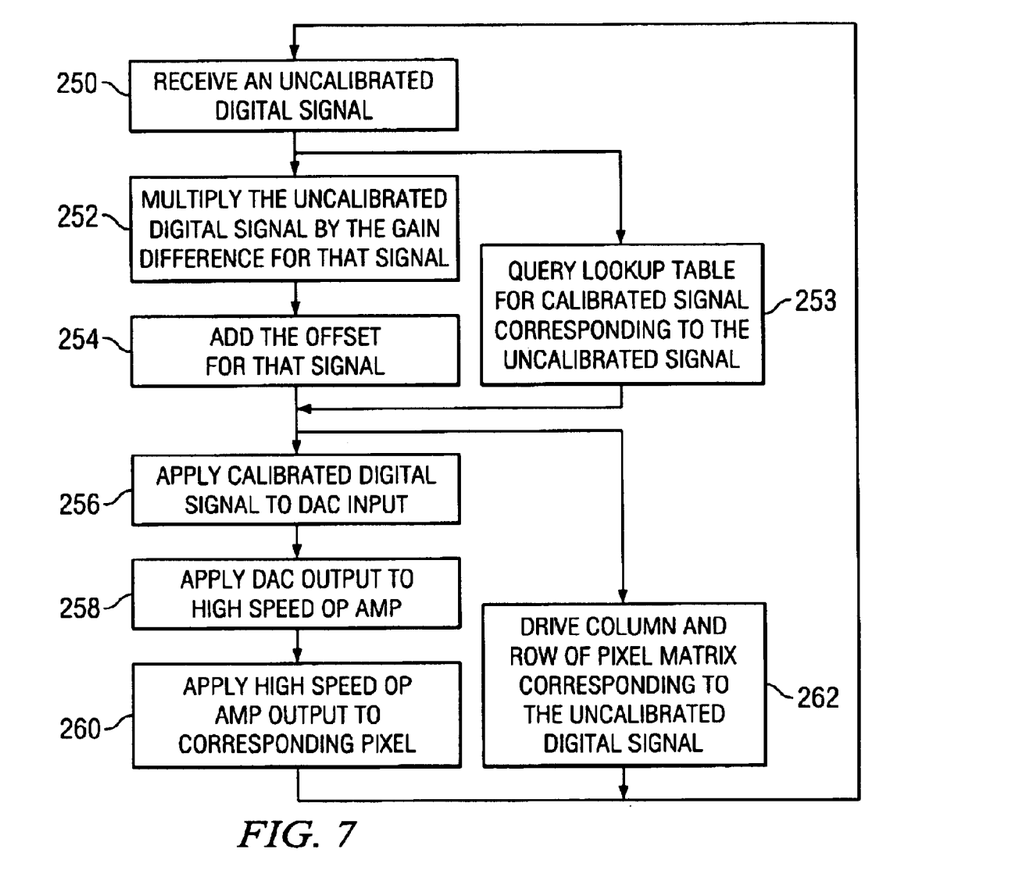
FIG. 7 is a logic flow diagram illustrating a method for actuating a liquid crystal display in accordance with one embodiment of the present invention.

FIG. 7 is a logic flow diagram illustrating a method for actuating a liquid crystal display in accordance with one embodiment of the present invention. In the first step 250, an uncalibrated digital signal reaches the driver circuit. In one second step 252, the uncalibrated signal is multiplied by the gain difference for that signal. In one embodiment, the gain difference for signals in one range may differ from the gain difference for signals in another range. The next step 254, adds an offset to the product of step 252. As with step 252, the offset may be different for signals in different ranges. In another embodiment, step 253 replaces one or both of steps 252 and 254. In step 253 the calibrated signal is stored and accessible based on the uncalibrated. For example, the calculations of steps 252 and 254 can be performed for every possible input signal and the results stored in a lookup table.

Once a calibrated signal is produced by step 253 or 254, two operations occur in parallel. The driver circuit sends control signals to the liquid crystal display to drive the column and row that define the pixel corresponding to the calibrated voltage in step 262. The calibrated voltage is applied to a DAC input in step 256. Then the DAC output is applied to a high speed operational amplifier in step 258. In the last step for the current pixel 260, the operational amplifier output is applied to the liquid crystal display matrix and drives the pixel identified by the column and row drivers. The digital signal for the next pixel is then received 250. In one embodiment, the electronics may process more than one pixel simultaneously in parallel circuitry. In another embodiment, the circuitry may be pipelined so that the next pixel starts being processed before the current pixel is finished.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

What is claimed is:

1. A system for actuating a liquid crystal display, comprising:
   (a) a matrix of liquid crystal pixels;
   (b) a digital-to-analog converter adapted to apply at an output a pixel charging voltage corresponding to a calibrated multi-bit digital signal received at an input and coupled to the matrix to apply the pixel charging voltage to at least one pixel;
   (c) a reference voltage generator adapted to apply one of at least a first and second reference voltages at an output;
   (d) a comparator with first and second inputs and an output, the first input coupled to the output of the reference voltage generator and the second input coupled to the output of the digital-to-analog converter, the comparator adapted to provide one of two signals at the output depending upon which input receives a higher voltage;
   (e) a digital calibrator coupled at a first output to the input of the digital-to-analog converter and adapted to: receive at a first input an uncalibrated multi-bit digital signal, modify the uncalibrated multi-bit digital signal based at least in part on the output of the comparator to produce the calibrated multi-bit digital signal, and apply the calibrated multi-bit digital signal to the first output;
   (f) a second digital-to-analog converter adapted to apply at an output a pixel charging voltage corresponding to a calibrated multi-bit digital signal received at an input from the digital converter and coupled to the matrix to apply the pixel charging voltage to at least one pixel; and
   (g) a multiplexer circuit, wherein the digital-to-analog converters are coupled to the second input of the comparator through the multiplexer circuit and the reference voltage generator is coupled to the first input of the comparator through the multiplexer circuit.

2. The system for actuating a liquid crystal display according to claim 1, wherein, in response to at least one control signal, the multiplexer circuit applies one of the at least two references voltages to the first input of the comparator and one of the digital-to-analog converter output voltages to the second input of the comparator.

* * * * *